United States Patent [19]

Kikuchi

[11] Patent Number: 5,749,442
[45] Date of Patent: May 12, 1998

[54] LEAD FRAME MAGAZINE FASTENING STRUCTURE

[75] Inventor: Eiji Kikuchi, Musashimurayama, Japan

[73] Assignee: Kabushiki Kaisha Shinkawa, Tokyo, Japan

[21] Appl. No.: 673,680

[22] Filed: Jun. 25, 1996

[30] Foreign Application Priority Data

Jun. 26, 1995 [JP] Japan .................................. 7-182165

[51] Int. Cl.⁶ .................................................. B66B 9/04
[52] U.S. Cl. ........................................ 187/272; 269/21
[58] Field of Search ................................. 187/272, 273, 187/274, 250, 414; 269/20, 21

[56] References Cited

U.S. PATENT DOCUMENTS 5,397,214  3/1995  Cheung ................................. 187/274

FOREIGN PATENT DOCUMENTS 57-62152  4/1982  Japan .......................... B65H 31/22

Primary Examiner—Kenneth Noland
Attorney, Agent, or Firm—Koda and Androlia

[57] ABSTRACT

A lead frame magazine fastening structure used with, for instance, a semiconductor bonding machine including raising-and-lowering shafts passing through a magazine setting plate of an elevator device and a positioning assembly comprising pins and a vacuum suction pad provided in the magazine setting plate. A lead frame magazine for accommodating lead frames in a stacked fashion is comprised of a bottom plate and vertical side bars along with a magazine supporting plate placed on the bottom plate and is placed on the magazine setting plate of the elevator device. When the elevator device is actuated, the raising-and-lowering shafts raise only the magazine supporting plate on which the lead frames are placed while the bottom plate of the magazine is held on the magazine setting plate of the elevator device by the positioning assembly.

3 Claims, 3 Drawing Sheets

LEAD FRAME MAGAZINE FASTENING STRUCTURE

BACKGROUND OF THE INVENTION

1. Field of the Invention

The present invention relates to a magazine fastening structure which is used in a die bonding apparatus, a wire bonding apparatus, etc., and more particularly to a magazine fastening structure for fastening a stacking type magazine, in which lead frames are accommodated in a stacked configuration, to an elevator device.

2. Prior Art

On the loader side of a bonding apparatus such as a die bonding apparatus and a wire bonding apparatus, a lead frame magazine which accommodates lead frames therein is mounted to an elevator device. The lead frames are extracted from the magazine one at a time and transferred to the working area of the bonding apparatus.

Two types of lead frame magazines are currently known: a stacking type magazine and a separation type magazine. The stacking type magazine is open at the top so that lead frames are accommodated in a stacked configuration. The separate accommodation type magazine is in a box shape having grooves formed at uniform intervals; and side edge areas of the lead frames are placed on the grooves so that each one of the lead frames are accommodated separately. The fastening structure of the present invention is used in the first type of lead frame magazine, i.e., the stacking type magazine.

In the stacking type magazine, the magazine is mounted on the elevator device, and the elevator device is actuated so that the uppermost lead frame inside the magazine is raised at a suction holding level where the lead frame is held by a suction holding head. The uppermost lead frame is then held by suction to the suction holding head, taken out of the magazine, and placed on guide rails. When the uppermost lead frame is thus taken out of the magazine, the elevator device is actuated so that the lead frames are raised, causing the next uppermost lead frame to be positioned at the suction holding level.

In the case of the separate accommodation type magazine, on the other hand, the elevator device is actuated so that the lead frame that is to be conveyed (located inside the magazine) is positioned at the conveying level. Then, the lead frame inside the magazine which has been positioned at the conveying level is pushed out onto the guide rails by a pusher. When the lead frame is pushed out onto the guide rails, the elevator device is actuated so that the magazine is raised or lowered, thus causing the next lead frame inside the magazine to be positioned at the conveying level.

Conventionally, a fastening structure used for fastening the magazines to the elevator device has been constructed in the following manner: a box-form magazine holder which holds the magazine and is roughly U-shaped in cross section is fastened to the raising-and-lowering part of the elevator device, and the magazine is pressed against one of inside walls of the magazine holder by a plate spring which is installed on the other inside wall of the magazine holder.

Japanese Patent Application Laid-Open (Kokai) No. 57-62152 is an example of a magazine fastening structure although the magazine in this Publication is a separate accommodation type magazine.

In bonding apparatuses, the guide rails for guiding lead frames to the bonding areas of the bonding apparatuses (i.e., the conveying direction of the lead frames) form the front side of the apparatuses; accordingly, the magazine is set in the magazine holder so that the long side of the magazine is parallel to the guide rails. As a result, in the case of the conventional magazine fastening structure, mounting and dismounting of the magazine to and from the magazine holder must be accomplished by positioning the magazine to one side of the magazine holder and then moving the magazine sideways (horizontally). Accordingly, such a magazine fastening structure is inferior in terms of working characteristics.

If the position of a plate spring is changed in the magazine holder, it is possible to set the magazine on the magazine holder from above. However, since the magazine holder has a fixed height, the magazine must be positioned above the magazine holder and then inserted into the magazine holder. Accordingly, there are problems in terms of the working characteristics of the magazine mounting and dismounting processes.

In the case of the magazine holder that is equipped with a plate spring, whenever there is a change in the size of the magazine (i.e., a change in the width or length of the lead frames) due to a change in the product being handled, the magazine holder must be replaced by another magazine holder which is suited to the new magazine. This replacement work is done by loosening and tightening bolts and nuts which fasten the magazine holder in place; accordingly, a quick response to changes in the product to be handled is impossible.

SUMMARY OF THE INVENTION

Accordingly, the object of the present invention is to provide a magazine fastening structure which allows easy mounting and dismounting of the magazine to and from the elevator device, so that superior working characteristics are obtained, and which also allows easy replacement of the magazine in cases where there is a change in the type of product to be handled.

The object is accomplished by a unique structure for fastening a lead frame magazine to an elevator device in which the lead frame magazine is comprised of a magazine main body in which lead frames are accommodated in a stacked configuration and a frame supporting plate which is installed in the magazine main body so as to support thereon the stacked lead frames and can be raised and lowered, and a magazine setting plate is installed on the elevator device; and in addition, raising-and-lowering members of the elevator device are installed so as to be raised and lowered while passing through the magazine setting plate, the bottom plate of the magazine main body is positioned on the magazine setting plate by a positioning means and fastened in place by a vacuum suction holding means, and the frame supporting plate of the lead frame magazine is raised and lowered by the raising-and-lowering members of the elevator device.

In the above-described structure:

(a) the magazine main body comprises a bottom plate and frame accommodating members which are provided on the bottom plate so as to position the side surfaces of the lead frames, thus accommodating the lead frames in a stacked configuration, (b) the frame supporting plate is installed inside an area defined by the frame accommodating members and moved up and down, (c) the positioning means of the elevator device comprises positioning pins, which are provided in the magazine setting plate, and positioning holes, which are formed in the bottom plate of the magazine main body so that the positioning holes are fitted over the positioning pins, and (d) the vacuum suction holding means of the elevator means comprises a vacuum suction holding pad which is provided in the magazine setting plate so that the bottom plate of the magazine main body is held in place by suction holding.

With the structure above:

(1) The bottom plate of the magazine main body is positionally fixed to the magazine setting plate of the elevator device via the positioning means and the vacuum suction holding means. Accordingly, the lead frame magazine can be mounted on the magazine setting plate and fastened in place either from the front or back side of the elevator device. Thus, mounting and dismounting of the lead frame magazine can be executed easily, providing superior working characteristics.

(2) The magazine setting plate of the elevator device is for positionally fixing the lead frame magazine, and the raising-and-lowering members of the elevator device, which passes through the magazine setting plate and the bottom plate of the magazine main body, is for raising and lowering the frame supporting plate of the magazine main body. Accordingly, when the uppermost lead frame is to be positioned at the separation level (that is, when the uppermost lead frame in the lead frame magazine is to be taken out), the raising-and-lowering members of the elevator device push the frame supporting plate upward so as to push the stacked lead frames. In other words, the magazine main body is fastened to the magazine setting plate via the suction holding means, and therefore, is not moved up; instead, the raising-and-lowering members push the lead frames upward by pushing up only the frame supporting plate.

DETAILED DESCRIPTION OF THE PREFERRED EMBODIMENTS

Figure 1:
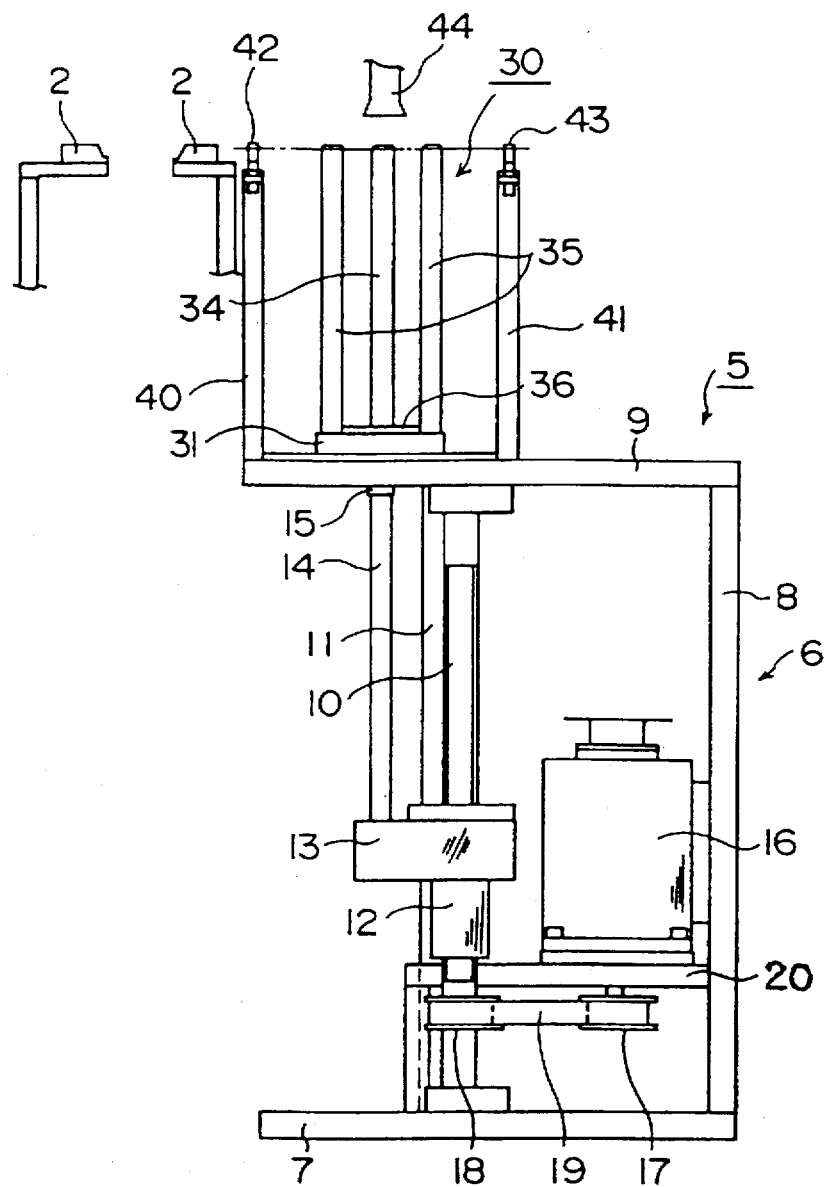
FIG. 1 is a side view which illustrates one embodiment of the magazine fastening structure of the present invention.
Figure 2:
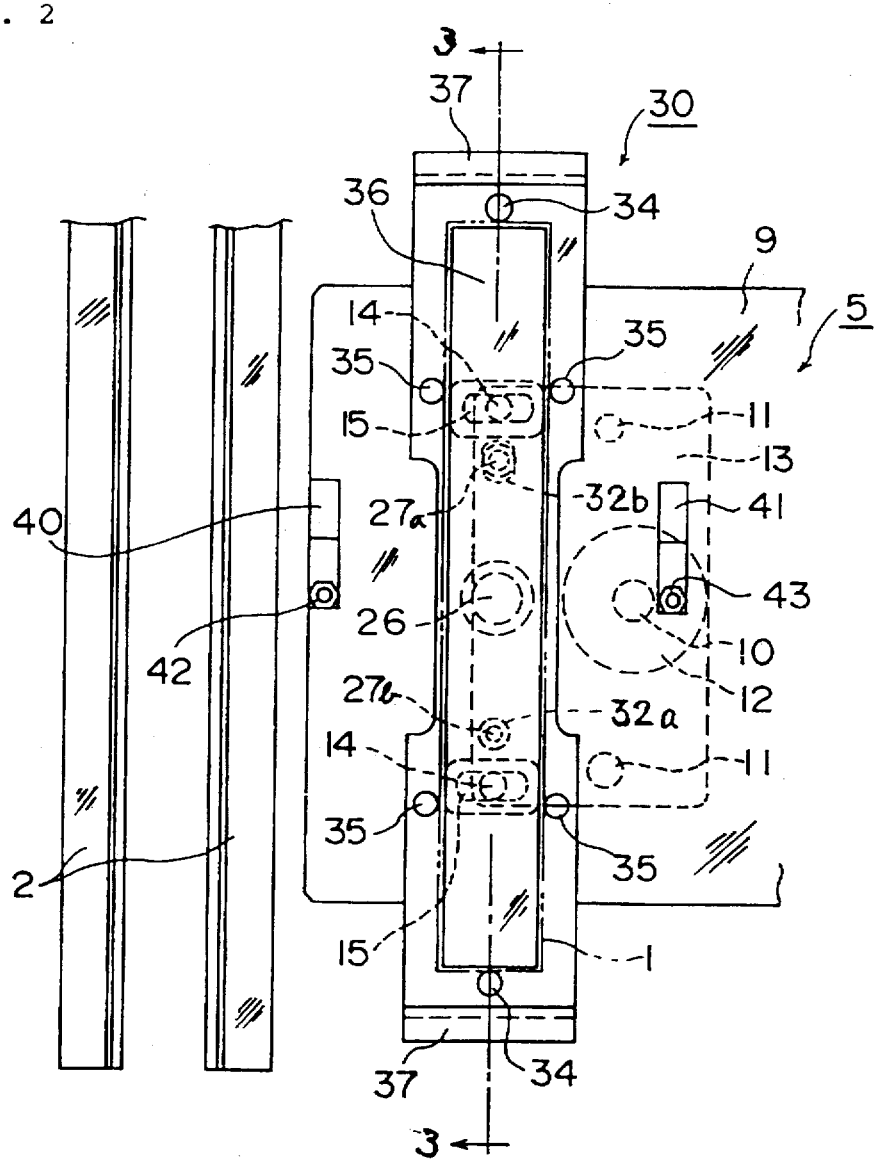
FIG. 2 is a top view of the embodiment shown in FIG. 1.
Figure 3:
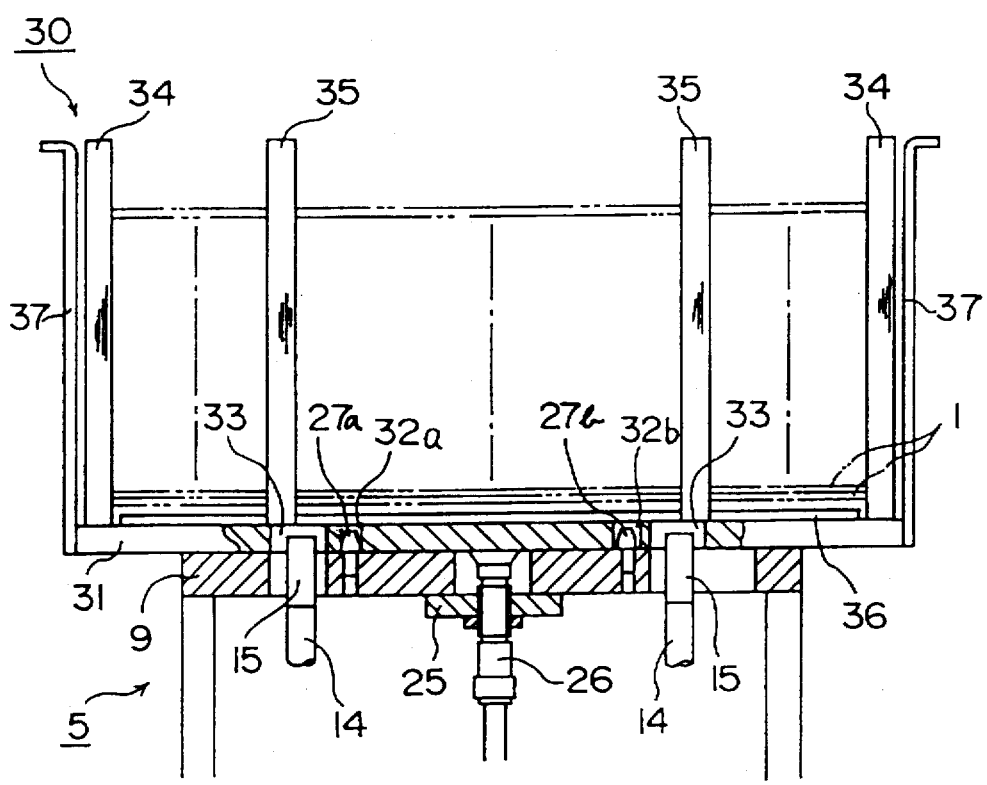
FIG. 3 is a partially sectional front view of the essential parts of the fastening structure taken along line 3—3 in FIG. 2.

In FIGS. 1 through 3, an elevator device 5 is installed on one side of, i.e., on the front side of, a pair of guide rails 2 which guide lead frames 1. The frame 6 of the elevator device 5 is comprised of a bottom plate 7, a side plate 8 and a magazine setting plate 9.

The upper and lower ends of a screw shaft 10 are rotatably supported between the bottom plate 7 and magazine setting plate 9. In addition, the upper and lower ends of two rotation-preventing shafts 11 are also fastened to the bottom plate 7 and magazine setting plate 9.

A moving block 12 having inner threads therein is screw-engaged with the screw shaft 10, and a raising-and-lowering shaft holder 13 which is fitted over the rotation-preventing shafts 11 so as to be movable up and down is fastened to the moving block 12.

Raising-and-lowering shafts 14 which pass through the magazine setting plate 9 and extend upward are fastened to the raising-and-lowering shaft holder 13, and push-up members 15 are attached to the upper ends of the raising-and-lowering shafts 14.

A motor 16 is mounted on a motor attachment frame 20 which is provided on the bottom plate 7 and side plate 8, and a first timing pulley 17 is coupled to the output shaft of the motor 16. A second timing pulley 18 is fastened to the screw shaft 10 so as to face the timing pulley 17 horizontally, and a timing belt 19 is installed between the first timing pulley 17 and the second timing pulley 18.

As best seen from FIG. 3, a suction holding pad support 25 is attached to the undersurface of the magazine setting plate 9, and a vacuum suction holding pad 26 is fastened to the suction holding pad support 25 so that the upper end of the vacuum suction holding pad 26 protrudes slightly over the upper surface of the magazine carrying table 9. The vacuum suction holding pad 26 is connected to a vacuum pump (not shown). Furthermore, positioning pins 27a and 27b are fastened to the magazine setting plate 9 so that they are located on either side of the vacuum suction holding pad 26.

A lead frame magazine 30 is set on the magazine setting plate 9. Positioning holes 32a and 32b are formed in the bottom plate 31 of the magazine 30 so as to positionally correspond to the positioning pins 27a and 27b. Push-up member insertion holes 33 which are through holes and larger than the push-up members 15 are formed in the bottom plate 31 of the magazine 30 so as to positionally correspond to the push-up members 15. The positioning hole 32a has a size which allows the secure engagement of the positioning pin 27a, while the positioning hole 32b is formed as a slot, which extends in the direction of length of the lead frames 1, so that the positioning pin 27b is loosely engaged in the positioning hole 32b.

Two frame accommodating rods 34, which come into contact and position the short side surfaces of the lead frames 1, and four frame accommodating rods 35, which come in contact and position the long side surfaces of the lead frames 1, are fastened to the bottom plate 31 of the magazine 30. In other words, the main body of the magazine 30 is constructed from the bottom plate 31 and frame accommodating rods 34 and 35.

A lead frame supporting plate 36 which is the same size as the lead frames 1 or slightly smaller than the lead frames 1 is provided on the bottom plate 31 so that the plate 36 covers the through holes 33, can be separated from the bottom plate 31 and is located inside an area defined or surrounded by the frame accommodating rods 34 and 35.

Two handles 37 which allow the magazine 30 to be held by hands are fastened to the bottom plate 31 so as to be located outside the frame accommodating rods 34.

Two sensor attachment plates 40 and 41 are fastened to the magazine setting plate 9 so as to be outside the bottom plate 31 of the magazine 30 and to face the longer sides of the lead frames 1 accommodated in the magazine 30. A light-emitting device 42 is provided above the upper end of the sensor attachment plate 40, and a light-receiving device 43 is fastened to the upper end of the sensor attachment plate 41 so as to face the light-emitting device 42.

In FIG. 1, the reference numeral 44 is a suction holding head 44 which moves up and down. The suction holding head 44 also makes a reciprocating motion between the magazine 30 and a point above the guide rails 2 by a driving means (not shown).

Next, the operation of the above embodiment will be described.

A plurality of lead frames 1 are stacked as indicated by a dotted line in FIG. 3 on the lead frame supporting plate 36 of the lead frame magazine 30. The lead frames 1 are located in the area defined by the frame accommodating rods 34 and 35.

Then, the handles 37 are gripped by the hands and the magazine 30 is set on the magazine setting plate 9 so that the positioning holes 32 formed in the bottom plate 31 of the magazine 30 are aligned with the positioning pins 27a and 27b.

When the vacuum of the vacuum suction holding pad 26 is turned on, the bottom plate 31 of the magazine 30 is held to the vacuum suction holding pad 26 by the vacuum suction.

By switching on the starting switch (not shown) of the motor 16, the screw shaft 10 is caused to rotate via the first timing pulley 17, timing belt 19 and second timing pulley 18; as a result, the moving block 12, raising-and-lowering shaft holder 13 and raising-and-lowering shafts 14 are moved upward, and the lead frame supporting plate 36 is pushed up by the push-up members 15, so that the lead frames 1 stacked on the lead frame supporting plate 36 are pushed up.

When the uppermost lead frame 1 on the lead frame supporting plate 36 is moved up so as to block the light beam emitted by the light-emitting device 42, the light-receiving device 43 outputs a motor "stop" signal, so that the motor 16 stops.

At this moment, the suction holding head 44 is positioned above the magazine 30.

When the light-receiving device 43 outputs the motor "stop" signal, the suction holding head 44 is simultaneously moved downward and holds the uppermost lead frame by vacuum suction.

The suction holding head 44 is then moved up to a point above the guide rails 2 and is moved down so as to place the lead frame 1 on the guide rails 2. The lead frame 1 thus placed on the guide rails 2 is pushed along the guide rails toward the working area of a bonding apparatus by a pusher (not shown).

When the suction holding head 44 holds the uppermost (next) lead frame 1 inside the magazine 30 and is moved up, the motor 16 again starts so that the magazine 30 is raised. Then, when the lead frame 1 held by the suction holding head 44 is detected by the light-receiving device 43, the motor 16 stops.

The sequence described above is repeated for the following lead frames.

When all of the lead frames 1 are taken out of the magazine 30, the magazine 30 is replaced by a new magazine 30 that contains lead frames 1 in a stacked fashion. The empty magazine 30 is removed by hand by raising the empty magazine 30 via the handles 37 after the vacuum of the vacuum suction holding pad 26 is switched off.

As seen from the above, the bottom plate of the lead frame magazine main body is affixed to the magazine setting plate of the elevator device by a positioning and vacuum suction holding means; accordingly, the lead frame magazine can be positioned on the magazine setting plate and fastened in place thereon either from the front or other side of the elevator device. Accordingly, mounting and dismounting of the magazine is easy, and superior working characteristics are obtained.

Furthermore, the magazine setting plate is used as a positioning part for the elevator device, and the raising-and-lowering members of the elevator device is passed through the magazine setting plate and the bottom plate of the elevator device so as to raise the frame supporting plate of the magazine main body. Accordingly, when the uppermost lead frame is positioned so as to be taken out of the magazine, the raising-and-lowering members of the elevator device push the frame supporting plate upward so that the stacked lead frames are moved upward. In other words, the magazine main body is fastened to the magazine setting plate so as not to be moved up; and the raising-and-lowering members push only the lead frames upward via the frame supporting plate.

As seen from the above, according to the present invention, the lead frame magazine fastening device includes:

a lead frame magazine including a magazine main body in which lead frames are accommodated in a stacked configuration;

a frame supporting plate provided in the magazine main body so as to be moved up and down and to support the stacked lead frames;

a magazine setting plate provided on an elevator device;

raising-and-lowering members provided in the elevator device so as to be moved up and down while passing through the magazine setting plate; and a bottom plate of the magazine main body positionally fixed to the magazine setting plate by a positioning means and by a vacuum suction holding means; and the frame supporting plate is moved up and down by the raising-and-lowering members of the elevator device.

Accordingly, the lead frame magazine can be easily mounted to and dismounted from the elevator device, so that superior working characteristics are obtained. In addition, the magazine can easily be replaced when there is a change in the type of product (lead frame) being handled.

I claim:

1. A structure for fastening a magazine to an elevator device comprising: a magazine main body in which lead frames are accommodated in a stacked configuration, a frame supporting plate installed in said magazine main body so as to be moved up and down and to support said stacked lead frames thereon, a magazine setting plate installed on said elevator device, raising-and-lowering members provided in said elevator device so as to be moved up and down while passing through said magazine setting plate; and a bottom plate of said magazine main body is positioned. on said magazine setting plate by a positioning means and fastened in place by a vacuum suction holding means, and said frame supporting plate is raised and lowered by said raising-and-lowering members of said elevator device.

2. A structure for fastening a magazine to an elevator device according to claim 1, wherein said magazine main body is comprised of a bottom plate and frame accommodating members which are fastened to said bottom plate so as to position side surfaces of said lead frames, thus accommodating said lead frames in a stacked configuration, said frame supporting plate is installed inside said frame accommodating members so as to be raised and lowered, said positioning means comprises positioning pins, which are provided in said magazine setting plate, positioning holes, which are formed in said bottom plate of said magazine main body so that said positioning holes fitted over said positioning pins, and said vacuum suction holding means comprises a vacuum suction holding pad which is provided in said magazine setting plate so that said bottom plate of said magazine main body is held in place by suction holding.

3. A structure for fastening a lead frame magazine to an elevator device wherein:

said lead frame magazine comprising:
- a bottom plate with a through opening provided therein, said bottom plate being provided with a positioning hole on a bottom surface thereof,
- a frame supporting plate provided on said bottom plate so as to cover said opening in a separable fashion from said bottom plate, a plurality of lead frames being placed on said frame supporting plate in a stacked fashion, and
- a plurality of frame accommodating members secured to said bottom plate so as to define a lead frame accommodation area surrounded by said plurality of frame accomodation members so as to accommodate said plurality of lead frames therein, and said elevator device comprising:
- a magazine setting plate provided at a top portion of said elevator device so that said bottom plate of said lead frame magazine is set thereon,
- raising-and-lowering means provided in said elevator device so as to be moved up and down while passing through said magazine setting plate, said raising-and-lowering means penetrate said through opening of said bottom plate of said lead frame magazine when said raising-and-lowering means is moved up so as to raise said lead frame supporting plate of said lead frame magazine, and
- a positioning means and a vacuum suction holding means provided in said magazine setting plate of said elevator device, said positioning means being engageable with said positioning hole of said bottom plate of said lead frame magazine and said vacuum suction holding means coming into contact with said bottom plate of said lead frame magazine so as to positionally secure said bottom plate of said lead frame magazine on said magazine setting plate of said elevator device.

\* \* \* \* \*